United States Patent
Hollander et al.

(10) Patent No.: US 11,999,366 B2
(45) Date of Patent: Jun. 4, 2024

(54) SYSTEM AND METHODS THEREOF FOR MONITORING PROPER BEHAVIOR OF AN AUTONOMOUS VEHICLE

(71) Applicant: Foretellix Ltd., Tel Aviv (IL)

(72) Inventors: Yoav Hollander, Kiryat Ono (IL);
Oded Doron Hirschfeld, Herzliya (IL);
Yaron Kashai, Sde Warburg (IL)

(73) Assignee: FORETELLIX LTD., Tel Aviv (IL)

( * ) Notice: Subject to any disclaimer, the term of this patent is extended or adjusted under 35 U.S.C. 154(b) by 97 days.

(21) Appl. No.: 17/122,124

(22) Filed: Dec. 15, 2020

(65) Prior Publication Data

US 2021/0179124 A1 Jun. 17, 2021

Related U.S. Application Data

(60) Provisional application No. 62/949,098, filed on Dec. 17, 2019.

(51) Int. Cl.
*B60W 30/00* (2006.01)
*B60W 30/095* (2012.01)
*B60W 50/04* (2006.01)
*B60W 50/00* (2006.01)

(52) U.S. Cl.
CPC ...... *B60W 50/045* (2013.01); *B60W 30/0956* (2013.01); *B60W 2050/0018* (2013.01); *B60W 2050/0082* (2013.01)

(58) Field of Classification Search
None
See application file for complete search history.

(56) References Cited

U.S. PATENT DOCUMENTS

| | | |
|---|---|---|
| 9,789,880 B2 | 10/2017 | Sweeney et al. |
| 9,845,164 B2 | 12/2017 | Ahmed et al. |
| 9,902,403 B2 | 2/2018 | Donnelly et al. |
| 9,969,326 B2 | 5/2018 | Ross et al. |
| 10,106,135 B2 | 10/2018 | Coelingh et al. |
| 10,267,908 B2 | 4/2019 | Luders et al. |
| 10,289,114 B2 | 5/2019 | Mitchell et al. |
| 10,397,019 B2 | 8/2019 | Hartung et al. |

(Continued)

FOREIGN PATENT DOCUMENTS

| | | |
|---|---|---|
| CN | 110073352 A | 7/2019 |
| JP | 2019117329 A | 7/2019 |

(Continued)

OTHER PUBLICATIONS

Hollander, Yoav, "The Foretellix Blog: Bridging AV Verification and AV Regulation" Blog at WorldPress.com, Dec. 8, 2018.

(Continued)

*Primary Examiner* — James M McPherson
(74) *Attorney, Agent, or Firm* — M&B IP Analysts, LLC

(57) ABSTRACT

A system and methods thereof for monitoring proper behavior of an autonomous vehicle are provided. The method includes generating a plurality of agents, wherein each of the plurality of agents describes a physical object, wherein at least one of the plurality of agents is an agent for the DUT, generating a plurality of scenarios, wherein each scenario models a behavior of at least one of the plurality of agents, and monitoring an interaction between the plurality of agents and the DUT agent for a scenario modeling the respective agent.

27 Claims, 8 Drawing Sheets

(56) References Cited

U.S. PATENT DOCUMENTS

| | | | |
|---|---|---|---|
| 10,432,729 | B2 | 10/2019 | Lemmer et al. |
| 10,600,257 | B2 | 3/2020 | Jiang et al. |
| 10,613,534 | B2 | 4/2020 | Eickhoff et al. |
| 10,678,247 | B2 | 6/2020 | Jiang et al. |
| 10,689,006 | B2 | 6/2020 | Wendt et al. |
| 10,713,500 | B2 | 7/2020 | Yang et al. |
| 10,796,371 | B1 | 10/2020 | Floyd et al. |
| 11,238,674 | B2* | 2/2022 | Amelunxen ............ G09B 9/04 |
| 2005/0275717 | A1* | 12/2005 | Camus .................... G06T 7/593 348/42 |
| 2016/0140285 | A1 | 5/2016 | Han et al. |
| 2017/0132117 | A1* | 5/2017 | Stefan ................ G06F 11/3684 |
| 2017/0253254 | A1 | 9/2017 | Sweeney et al. |
| 2017/0286570 | A1* | 10/2017 | Kim ................... G06F 11/3688 |
| 2018/0089515 | A1 | 3/2018 | Yang et al. |
| 2018/0224855 | A1 | 8/2018 | Eickhoff et al. |
| 2018/0326991 | A1 | 11/2018 | Wendt et al. |
| 2018/0349547 | A1 | 12/2018 | Sun et al. |
| 2019/0004524 | A1 | 1/2019 | Wang et al. |
| 2019/0049954 | A1 | 2/2019 | Mitchell et al. |
| 2019/0064810 | A1 | 2/2019 | Jiang et al. |
| 2019/0064811 | A1 | 2/2019 | Du et al. |
| 2019/0064823 | A1 | 2/2019 | Jiang et al. |
| 2019/0066396 | A1 | 2/2019 | Jiang et al. |
| 2019/0066397 | A1 | 2/2019 | Du et al. |
| 2019/0101923 | A1 | 4/2019 | Sun et al. |
| 2019/0109777 | A1 | 4/2019 | Mircescu |
| 2019/0155289 | A1 | 5/2019 | McNeil et al. |
| 2019/0171895 | A1 | 6/2019 | Wang et al. |
| 2019/0202470 | A1 | 7/2019 | Glebov et al. |
| 2019/0210613 | A1 | 7/2019 | Sun et al. |
| 2019/0210617 | A1 | 7/2019 | Langbein |
| 2019/0241122 | A1 | 8/2019 | Cohen |
| 2019/0295335 | A1* | 9/2019 | Amelunxen ............ G06F 30/20 |
| 2019/0308617 | A1* | 10/2019 | Groult ..................... B60Q 1/50 |
| 2019/0310649 | A1 | 10/2019 | Halder |
| 2019/0317496 | A1 | 10/2019 | Korchev et al. |
| 2019/0317510 | A1 | 10/2019 | Sanchez |
| 2020/0094849 | A1* | 3/2020 | Weber ............... B60W 50/0205 |
| 2020/0209863 | A1 | 7/2020 | Eickhoff et al. |
| 2020/0257308 | A1 | 8/2020 | Herman |
| 2020/0339109 | A1* | 10/2020 | Hong ................. B60W 60/0011 |
| 2020/0346641 | A1 | 11/2020 | Woon et al. |
| 2020/0346643 | A1 | 11/2020 | Woon et al. |
| 2022/0048536 | A1* | 2/2022 | Kaplan .............. B60W 60/0011 |
| 2022/0242450 | A1* | 8/2022 | Sokolov ............ B60W 60/0015 |

FOREIGN PATENT DOCUMENTS

| | | |
|---|---|---|
| JP | 2019185783 A | 10/2019 |
| KR | 20190115467 A | 10/2019 |
| WO | 2018071708 A1 | 4/2018 |
| WO | 2019169604 A1 | 9/2019 |

OTHER PUBLICATIONS

International Search Report and Written Opinion of International Searching Authority for PCT/IB2020/061976, ISA/IL, Jerusalem, Israel, dated Jan. 10, 2021.

"Office Action dated Nov. 1, 2022; Japanese patent application No. 2021-547807" dated Nov. 1, 2022.

Office Action for Chinese Application No. 202080006705.8, dated Jun. 29, 2023. China National Intellectual Property Administration, Beijing, China.

First office action for application No. KR 10-2021-7020389, received on Apr. 9, 2024. Korean Intellectual Property Office, Republic of Korea.

* cited by examiner

SYSTEM AND METHODS THEREOF FOR MONITORING PROPER BEHAVIOR OF AN AUTONOMOUS VEHICLE

CROSS-REFERENCE TO RELATED APPLICATIONS

This application claims the benefit of U.S. Provisional Application No. 62/949,098 filed on Dec. 17, 2019, the contents of which are hereby incorporated by reference.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

TECHNICAL FIELD

The invention relates generally to autonomous vehicles and, more specifically, to monitoring proper performance of such vehicles.

BACKGROUND

Advances in the field of autonomous vehicles are rapid. More and more, such vehicles are scheduled to hit the roads in the coming decade, and experimental vehicles are roaming the roads of many cities around the world. Like every sophisticated device that has been designed by humans, the autonomous vehicle enjoys the benefit of the ingenuity of mankind, as well as experiencing its shortcomings. The latter manifest themselves as undesired, unpredicted, or erroneous behavior of the autonomous vehicle, putting in danger the vehicle's occupants as well as other people, animals, and property around the vehicle.

In order to prevent such errors from occurring, vehicles are first tested prior to their release to the roads, and then, as they are deployed on the road, vehicles have additional precautions installed to ensure that no mishaps occur. In addition, a driver is assigned to each such vehicle with a capability to override the operation of the vehicle when a handling or response error occurs. This, of course, allows for capture of such sequences and updating of the control systems of the vehicle so that, in future, cases of such hazardous situations may be prevented. However, these solutions are error-prone, as they are heavily dependent on the capture of such errors as a result of an intervention by the operator, or cases where some sort of damage has occurred. Errors that lead to an undesirable result are not monitored efficiently or captured when they may prevent an undesirable outcome from occurring.

It is, therefore, desirable to provide a solution that allows monitoring of the operation of an autonomous vehicle based on predetermined expectations of proper operations, rather than waiting for a dramatic error to occur. It would, therefore, be advantageous to test the autonomous vehicle in a controlled environment, such as a simulation or a test track, by exposing it to a large number of scenarios while monitoring the autonomous vehicle's performance systematically.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the terms "some embodiments" or "certain embodiments" may be used herein to refer to a single embodiment or multiple embodiments of the disclosure.

Certain embodiments disclosed herein include a method for monitoring proper behavior of a device under test (DUT). The method comprises generating a plurality of agents, wherein each of the plurality of agents describes a physical object, wherein at least one of the plurality of agents is an agent for the DUT; generating a plurality of scenarios, wherein each scenario models a behavior of at least one of the plurality of agents; and monitoring an interaction between the plurality of agents and the DUT agent for a scenario modeling the respective agent.

Certain embodiments disclosed herein also include a non-transitory computer readable medium having stored thereon instructions for causing a processing circuitry to execute a process for monitoring proper behavior of a device under test (DUT), the process comprising: generating a plurality of agents, wherein each of the plurality of agents describes a physical object, wherein at least one of the plurality of agents is an agent for the DUT; generating a plurality of scenarios, wherein each scenario models a behavior of at least one of the plurality of agents; and monitoring an interaction between the plurality of agents and the DUT agent for a scenario modeling the respective agent.

In addition, certain embodiments disclosed herein include a system for monitoring proper behavior of a device under test (DUT). The system comprises: a processing circuitry; and a memory, the memory containing instructions that, when executed by the processing circuitry, configure the system to: generate a plurality of agents, wherein each of the plurality of agents describes a physical object, wherein at least one of the plurality of agents is an agent for the DUT; generate a plurality of scenarios, wherein each scenario models a behavior of at least one of the plurality of agents; and monitor an interaction between the plurality of agents and the DUT agent for a scenario modeling the respective agent.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

It is important to note that the embodiments disclosed herein are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality.

In the field of autonomous vehicles, the vehicles are expected to perform at a perfection level that exceeds that of a human being. However, being designed and programmed by humans, errors and faults in the designs and programs installed in the vehicle may lead to undesired and unpredictable results. Accordingly, a measurable scenario description language (MSDL) is used to generate agents that operate a monitoring device that monitors a data stream, where such a data stream provides information regarding the behavior of the monitored vehicle when compared to behavior expressed by MSDL scenarios. The agents are created using the MSDL and are executed to monitor the received stream and detect and report anomalies, key performance indicators, and scenario coverage. That is, if a behavior of a monitored vehicle is different from expectations, that anomaly is reported. The MSDL also allows the description of unmonitored elements within the environment of the monitored vehicle.

Figure 1:
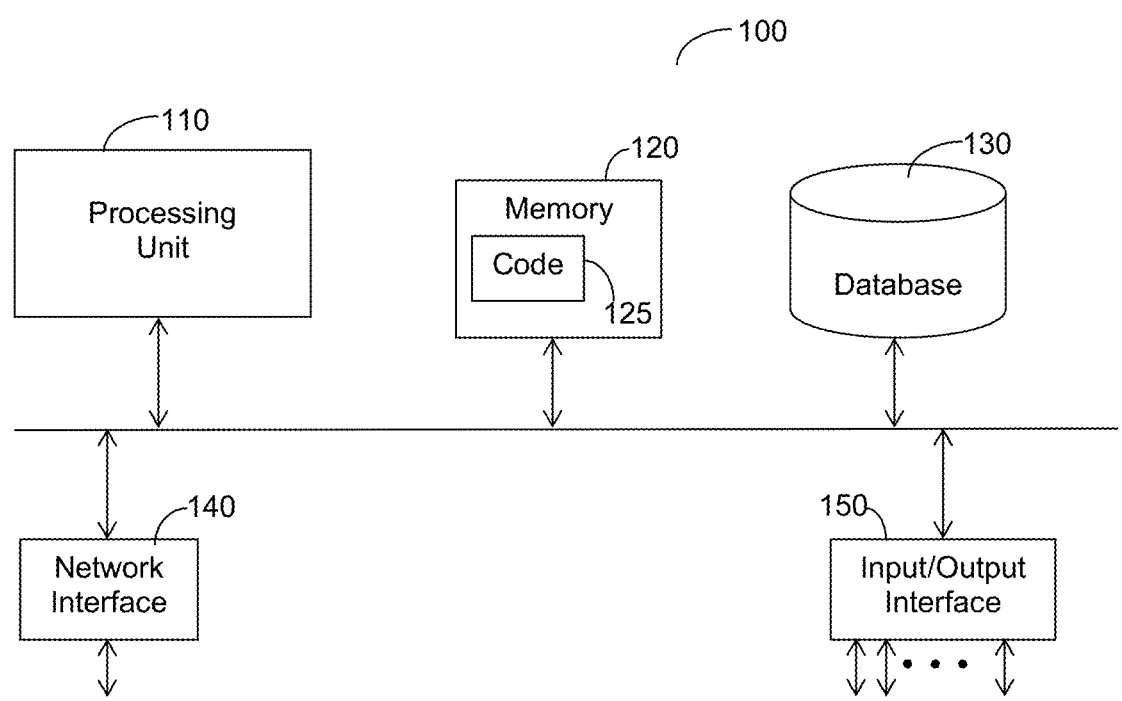
FIG. 1 is a schematic diagram of a monitoring system for activating agents and scenarios to monitor behavior of an autonomous vehicle according to an embodiment.

FIG. 1 depicts an example schematic diagram of a monitoring system 100 for activating agents and scenarios to monitor behavior of an autonomous vehicle according to an embodiment. The monitoring system 100 comprises a processing unit 110 which is communicatively connected to a memory 120. The memory 120 may comprise both volatile memory, such as random-access memory (RAM), as well as non-volatile memory, such as read-only memory (ROM) and Flash memory. The memory 120 may have a portion of the memory 120 assigned to contain therein instructions that may be executed by the processing unit 110, as further explained herein.

A database (DB) 130 is further connected to the processing unit 110 and may contain therein various types of data as further discussed herein. The database (DB) 130 may include instructions for execution by the processing unit 110, or data to be processed by the processing unit 110. The database (DB) 130 may further accept therein data that was prepared or otherwise processed by the processing unit 110.

The data contained in the database (DB) 130 may include previously prepared constructs such as agents, which are discussed in greater detail herein. Furthermore, the database (DB) 130 may contain data streams, for example, video clips, that may be used for the purpose of monitoring a behavior of an autonomous vehicle according to the disclosed embodiments.

A network interface 140 is further connected to the processing circuitry 110. The network interface 140 enables the monitoring system 100 to receive and send data over a network, which may be wired or wireless. Relevant types of networks include but are not limited to: local area networks (LANs), wide area networks (WANs), metro area networks (MANs), cellular networks, WiFi® networks, and the like, as well any combination thereof. The data streams described herein may be, in an embodiment, provided to the monitoring system 100 using the network interface 140. Further, an input/output (I/O) interface 150 is may be connected to the processing unit 110. Such an interface may provide connectivity to various devices including, but not limited to, a computer screen, a touchscreen, a keyboard, a mouse, and other like input, output, or I/O devices. The uses of the various components of the monitoring system 100 are described in greater detail herein.

The processing circuitry 110 may be realized as one or more hardware logic components and circuits. For example, and without limitation, illustrative types of hardware logic components that can be used include field programmable gate arrays (FPGAs), application-specific integrated circuits (ASICs), Application-specific standard products (ASSPs), system-on-a-chip systems (SOCs), graphics processing units (GPUs), tensor processing units (TPUs), general-purpose microprocessors, microcontrollers, digital signal processors (DSPs), and the like, or any other hardware logic components that can perform calculations or other manipulations of information.

The memory 120 may be volatile (e.g., RAM, etc.), non-volatile (e.g., ROM, flash memory, etc.), or a combination thereof.

In one configuration, software for implementing one or more embodiments disclosed herein may be stored in the database 130. In another configuration, the memory 120 is configured to store software codes such as software code 125. The software code 125 includes any instructions developed using the MSDL. Software code 125 shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the processing unit 110, cause the processing unit 110 to perform the various processes described herein.

The database (DB) 130 may be any type of storage, such as magnetic storage, optical storage, and the like, and may be realized, for example, as flash memory or other memory technology, CD-ROM, Digital Versatile Disks (DVDs), or any other medium which can be used to store the desired information.

It should be understood that the embodiments described herein are not limited to the specific architecture illustrated in FIG. 1, and other architectures may be equally used without departing from the scope of the disclosed embodiments.

In order to demonstrate the operation of the monitoring system 100, an example scenario is described. It may be understood that other, like, scenarios may be readily developed and deployed for execution on the monitoring system 100 operating as a monitoring device. For the purpose of the instant example, a scenario known as 'cut-in and slow' is used. This is a scenario that is frequently encountered in traffic where one car cuts in front of another (e.g., the autonomous vehicle) and slows down.

The following is a step-by-step explanation of how the scenario 'cut-in and slow' is captured, according to the disclosed embodiments, using MSDL, from the definition and scenario setup, to the logical scenario description, and final realization of the scenario. The MSDL is used to ensure that the autonomous vehicle is performing as expected when testing, or otherwise monitoring the responses of the autonomous vehicle in simulation or from real data streams captured as the autonomous vehicle is present on the road. The responsibility of verification is in the hands of the programmer that using the MSDL to define the scenarios from the elements using the monitoring system 100 and as described herein.

The definition of a scenario for the purpose of verifying or monitoring a desired behavior is described in the instant exemplary case. It may be understood that other scenarios are possible without departing from the scope of the invention. In the example case, the autonomous vehicle may be going at essentially a constant speed, keeping to its lane for as long as possible. Another vehicle may approach from behind the autonomous vehicle, in a different lane, and may pass the autonomous vehicle. Then, the other vehicle may cut in front of the autonomous vehicle and into the autonomous vehicle's lane.

The other vehicle may then slow down, thereby forcing the autonomous vehicle to take the necessary measures to stay within a safe distance from the other vehicle, where the other vehicle may be in the autonomous vehicle's lane and in front of the autonomous vehicle. It may be understood that two behaviors are included in the given example, one behavior of the autonomous vehicles, and one behavior of the other vehicle. The definition of the scenario also defines coverage metrics and grading mechanisms which prove the verification goal was achieved. The metrics target maneuvers' parameters such as, but not by way of limitation, distance between cars and speed.

According to embodiments, all definitions of the scenario are implemented using the MSDL, as is described herein, and the execution of the scenario are monitored using, for example, the system 100. The metrics are also referred to in the art as key performance indicators (KPIs). The KPIs are typically physical parameters, such as, but not limited to speed, distance, acceleration, and the like. Coverage metrics are typically logical, Boolean, or discrete descriptions, queries, or the like, such as, for example, but not by way of limitation, 'has a take-over occurred?' 'has a cut-in occurred?' 'has a left or right-side cut-in occurred?' and the like.

Figure 2:
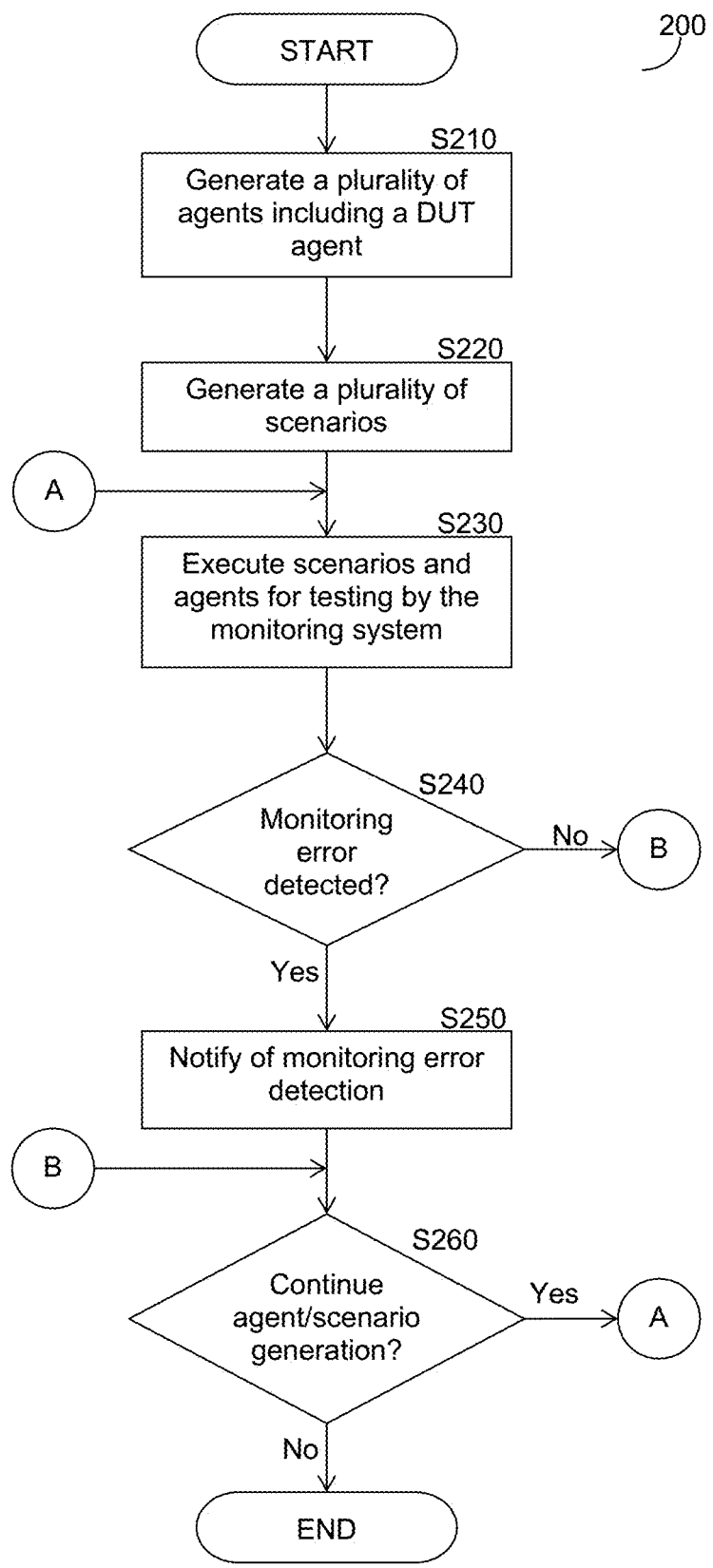
FIG. 2 is a flowchart describing a method for deployment of the monitoring system for an autonomous vehicle according to an embodiment.

FIG. 2 is an example flowchart 200 describing a method for the deployment of a monitoring system 100 for an autonomous vehicle according to an embodiment.

At S210, a plurality of agents, including at least an agent for a device under test (DUT), are generated. In a typical embodiment, the DUT agent is for an autonomous vehicle (AV). Each agent is described using MSDL, examples of the use of which are provided and more detailed, but not limiting, description of the MSDL is provided below.

An agent may use a previously-generated agent for the purpose of describing the newly-created agent. Therefore, a hierarchy of agents is established. In one embodiment, a root agent is an agent that calls upon all agents, either directly or through hierarchy levels thereof. An agent may describe a DUT, a vehicle, a road, a sidewalk, a person, an animal, a traffic light, a traffic cone, a barrier, a bicycle, a train, a weather element, a hazardous element, and like physical objects. It should be understood that the provided list is not exhaustive, and that other agents may be described using MSDL, a hierarchy of agents, or both. It may be further understood that such agents may be generated manually through a user interface (not shown) that is executed by the processing unit 110 or generated automatically.

An automatic extraction may be accomplished by using a data stream, for example, but not by way of limitation, a video stream, where an agent is generated for a desired physical object. The data stream may be provided through the network interface 140 in real-time or may be stored in the database (DB) 130 and used off-line. The agent may include a reference to a lower hierarchy agent which allows not recreating agents that have already been previously defined. For example, but not by way of limitation, if a vehicle operates lights as a result of change of environmental illumination, and the physical object of head lights turning on already exists as an agent, then, when creating the agent for the vehicle, use of the previously generated agent may be useful.

At S220 a plurality of scenarios are generated, the scenarios may also be described using MSDL, where a scenario may model a behavior of an agent. For example, but not by way of limitation, a car may have a drive scenario, a pedestrian may have a walk scenario, a traffic light may have a light change scenario, and the like. It should be appreciated that a traffic scenario may have more complex scenarios where multiple cars interact, such as, as examples and without limitation, a cut-in scenario wherein a car cuts in front of the DUT, a cut-in both sides scenario wherein two cars cut in front of the DUT, for example, from two different lanes, a cut-in and slow scenario wherein a car cuts in front of the DUT and then slows, and the like.

These complex scenarios may activate lower-level scenarios in their participating scenarios to properly perform. That is, 'cut-in' may call the drive scenario for each of the cars, thereby calling upon the 'cut-in' scenario multiple times. It may be understood that this list is not exhaustive, and that other scenarios may be described using MSDL, a hierarchy of scenarios, or both. It may be further understood that such scenarios may be generated manually through a user interface (not shown) that is executed by the processing unit 110 or generated automatically. An automatic extraction may be accomplished by using a data stream, such as, for example, but not by way of limitation, a video stream, from which a scenario is generated. The data stream may be provided through the network interface 140 in real-time or stored in the database (DB) 130 and used off-line. The scenario may include a reference to a lower hierarchy scenario which allows not recreating agents that have already been previously defined, and as further described herein.

At S230, the agents and the scenarios generated are executed by the monitoring system 100 for the purpose of monitoring the behavior of the DUT agent.

At S240, it is checked whether an error indication has been provided. In an embodiment, this check may detect when a scenario has successfully occurred. Checking may further include storing key performance indicators (parameters) and coverage data thereof. An error may be generated, for example and without limitation, in the case where the DUT agent entered an area of low illumination but has not activated the DUT's headlights. In another case, for example, a scenario of cut-in and slow, it is expected that the DUT agent will cause the slowing down of the DUT at a safe distance from the cutting-in vehicle, as executed by the agent. It may be understood that the minimum distance between the vehicles is a non-limiting example of a key performance indicator (KPI) that may be stored once a cut-in-and-slow scenario is detected. If an error has been detected at S240, then execution continues with S250. Otherwise, execution continues with S260.

At S250, a notification is generated indicating that an error was detected. In an embodiment, the scenario that led to the error notification is further provided, other notifications that enable the recreation of the sequence that led to the error in response of the agent of the DUT in a particular case may be provided, as well as any combination thereof.

At S260, it is checked if the monitoring should continue, for example by generation of additional agent(s) and/or scenario(s) and, if so, execution continues with S230. Otherwise, execution terminates.

Figure 3:
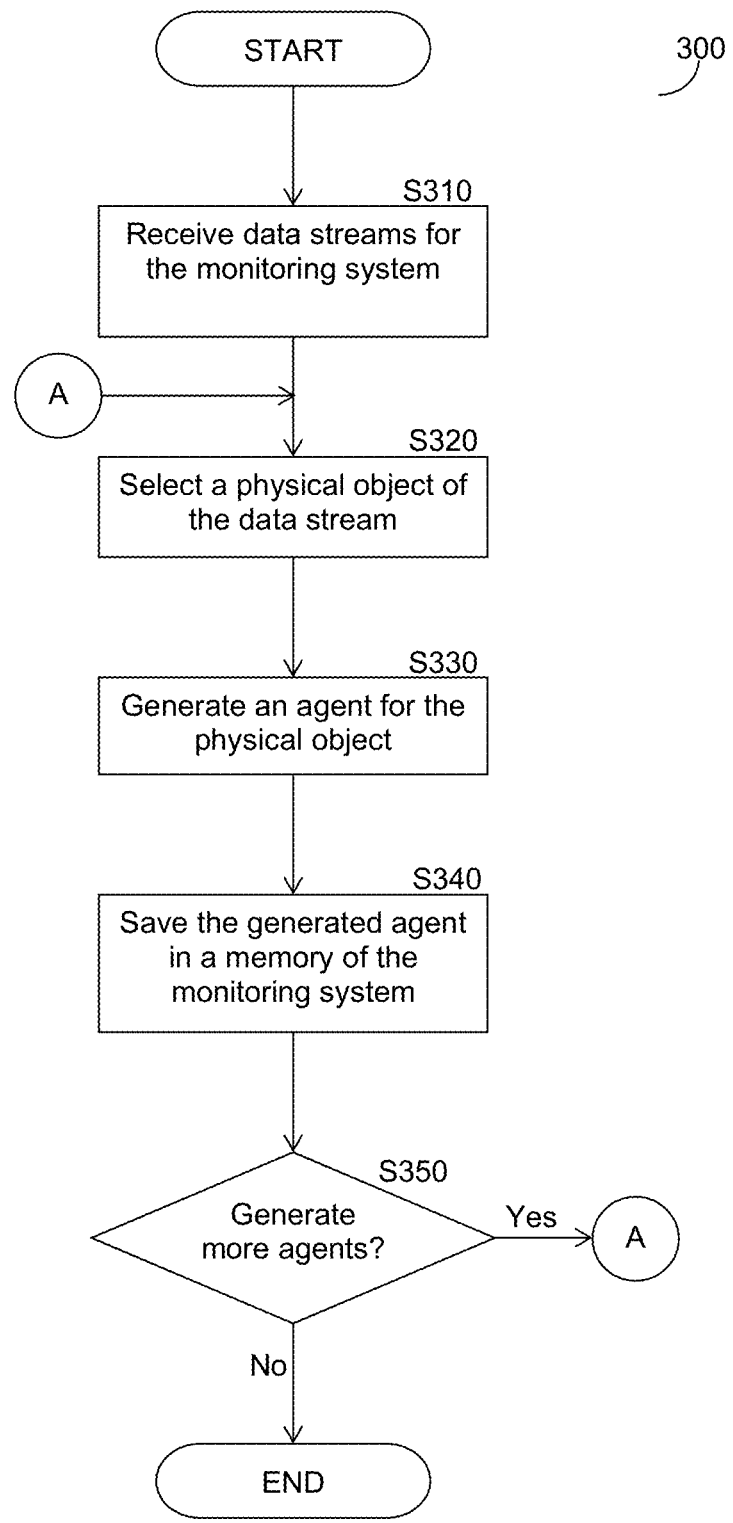
FIG. 3 is a flowchart describing a method for generation of at least an agent for the monitoring system according to an embodiment.

FIG. 3 depicts an example flowchart 300 describing a method for generating of at least an agent for the monitoring system according to an embodiment.

At S310, a data stream is received by the monitoring system 100. The data stream may be received over the network interface 140, for example, for real-time video, or from database (DB) 130, for example, for offline video processing.

At S320, a physical object, for example a DUT, a vehicle, a sidewalk, a person, or the like. is selected. Selection can be performed by means of a user interface (not shown) that allows, for example, a pointing device (not shown) connected to the I/O network interface 140, that is used to point and select a physical object provided by the data stream. It may be understood that the selection at S320 may be extended to the selection of a plurality of physical objects for the creation of respective agents for each of the physical objects without departing from the scope of the disclosed embodiments.

At S330, an agent is created for the physical object that may further use previously-defined agents, thereby creating a hierarchy of agents. An agent created at S330 may be of a specific type that matches the characteristics of a physical object, where the object type is defined using MSDL. In one embodiment, manual user intervention is may provide for direction of the generation of the agent when and where necessary. Furthermore, generation of two or more agents may occur in parallel.

At S340, the created agent is stored in memory, such as, for example, memory 120 in one embodiment or database (DB) 130 in another embodiment. An agent is created using the MSDL as discussed herein.

At S350 it is checked whether more agents are to be created, for example based on the data stream received by the monitoring system 100, and if so, execution continues with S320. Otherwise, execution terminates.

Figure 4A:
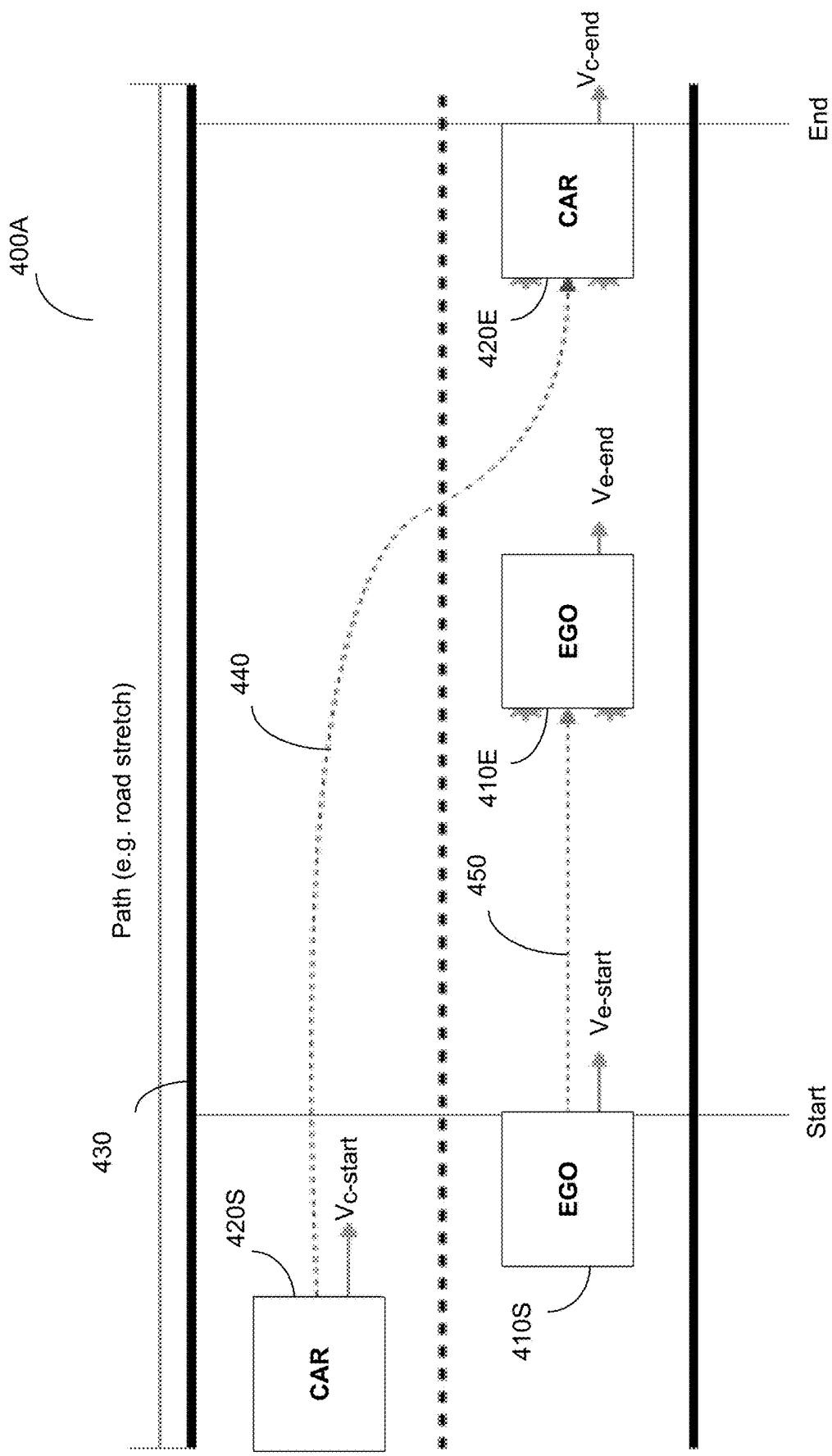
FIG. 4A is an end-to-end schematic description of a cut-in and slow scenario, according to an embodiment.

FIG. 4A is an example schematic description 400A of a cut-in and slow scenario, according to an embodiment. The autonomous vehicle (AV) is referred to in the figure as EGO, 410, and the other vehicle 420 is referred to in the figure as CAR. Accordingly, the autonomous vehicle 420 begins the scenario at a starting point 410S, and the other vehicle 420 begins the scenario in position 420S, which is behind position 410S. The other vehicle 420, having a relative speed greater than zero with respect to the AV 410, passes the AV 410 on travel path 440, cuts into the AV 410 lane, and slows down, reaching position 420E. This, in turn, forces the AV 410, moving on path 450, to slow down to accommodate for the change in speed of the other vehicle 420 in order to maintain safety requirements, thereby ending the scenario in position 420E.

Figure 4B:
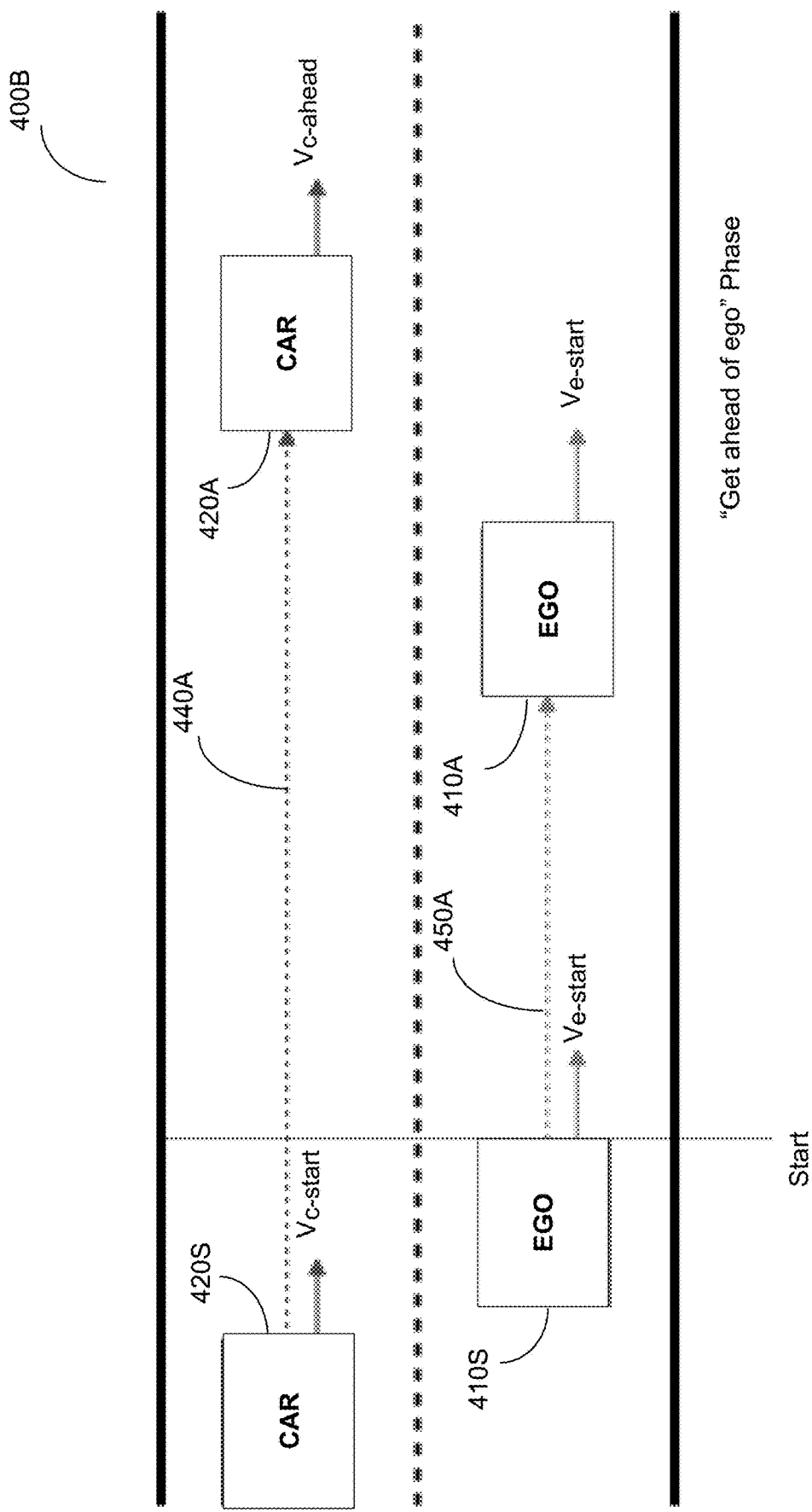
FIG. 4B is a schematic description of a get-ahead phase of the cut-in and slow scenario, according to an embodiment.
Figure 4C:
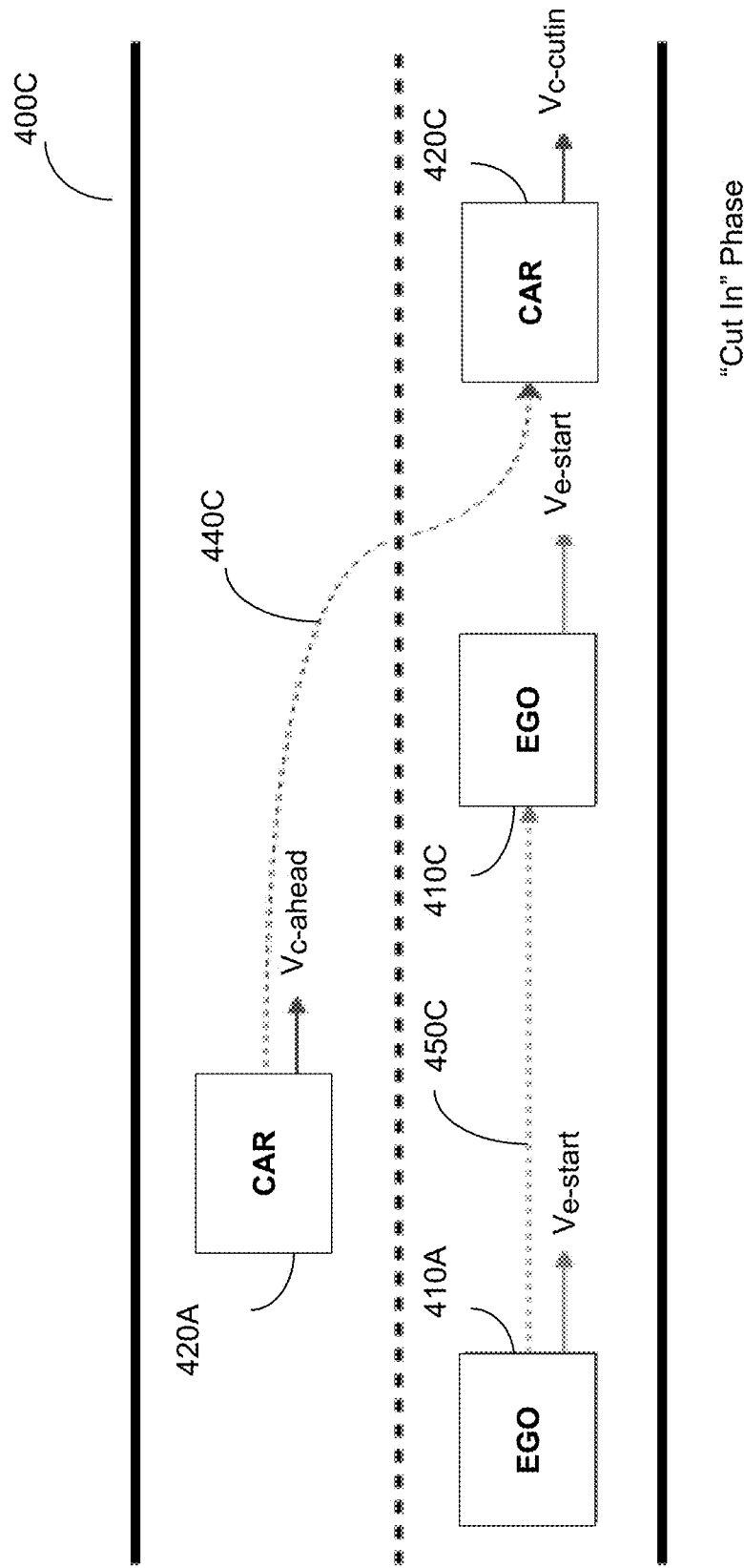
FIG. 4C is a schematic description of a cut-in phase of the cut-in and slow scenario, according to an embodiment.
Figure 4D:
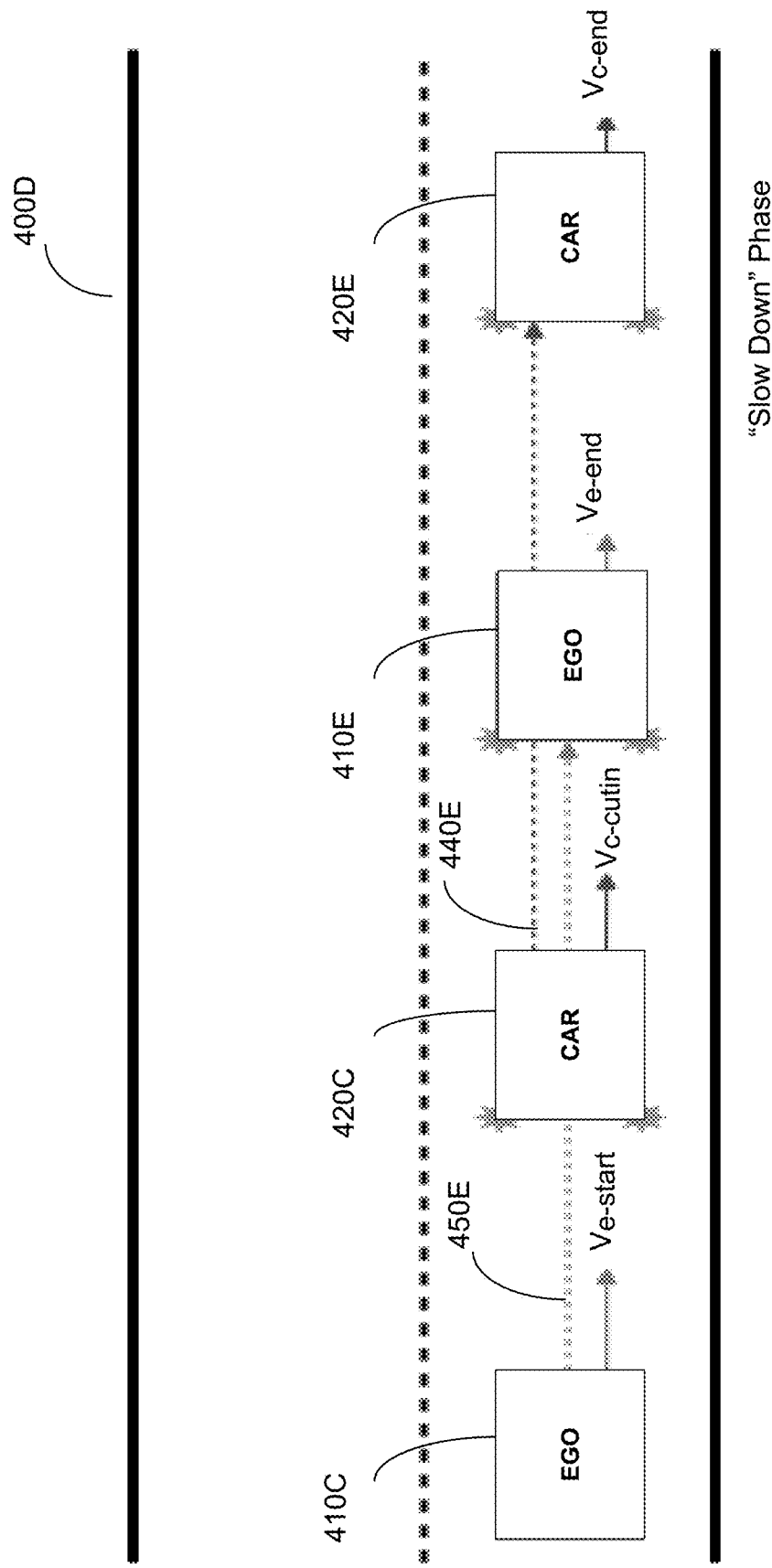
FIG. 4D is a schematic description of a slowdown phase of the cut-in and slow scenario, according to an embodiment.

The description provided in FIG. 4A may be performed in three separate phases: get ahead of the AV 410, and cut in and slow down (FIGS. 4B to 4D).

FIG. 4B is a schematic description 400B of a get-ahead phase of the cut-in and slow scenario, according to an embodiment. The first phase, described in FIG. 4B, is defined between the start position and the position where the vehicle 420 is ahead of the AV 410. In this phase, the vehicle 420 accelerates from 420S to 420A so as to get ahead of the AV 410A remaining in the same lane, traveling the distance 440A. During this period, the AV 410 begins at 410S and continues to 420A, covering the distance 450A as it maintains its speed and trajectory.

FIG. 4C is a schematic description 400C of a cut-in phase of the cut-in and slow scenario, according to an embodiment. In the second phase, depicted in FIG. 4C, the vehicle that started at 420A changes lanes to get in front of AV 410A in position 420C covering the distance 440C. At this time from AV 410A reached AV 410C covering distance 450C, still maintains its speed and trajectory if the cut-in is not aggressive (i.e., changing lanes at a sharp angle and/or at short distance between AV 410A and the vehicle 420A). The speed of the vehicle 420A at the end of the second phase can be equal to or greater than the speed at the start of the second phase. It may be understood that the new position of the AV 410 is now marked as 410C (AV 410 after being cut-in by vehicle 420A), and the vehicle 420A is now marked as 420C (vehicle 420 after cutting in before AV 410A, now referred to as AV 410C, as it is in a different position).

FIG. 4D is a schematic description 400D of a slowdown phase of the cut-in and slow scenario, according to an embodiment. In the third phase, shown in FIG. 4D, the vehicle 420C brakes and AV 410C must react in the same manner when the distance from AV 410C is 450E. The final speed of AV 410C is less than the initial speed of both vehicles when entering this third phase. Once done AV 410 is at AV 410E and AV 420 is at AV 420E. According to an embodiment, the MSDL allows the segmentation of a scenario into smaller sub-scenarios or phases, and may provide a built-in chaining mechanism, for example though a do_serial instruction as described further herein.

Figure 5:
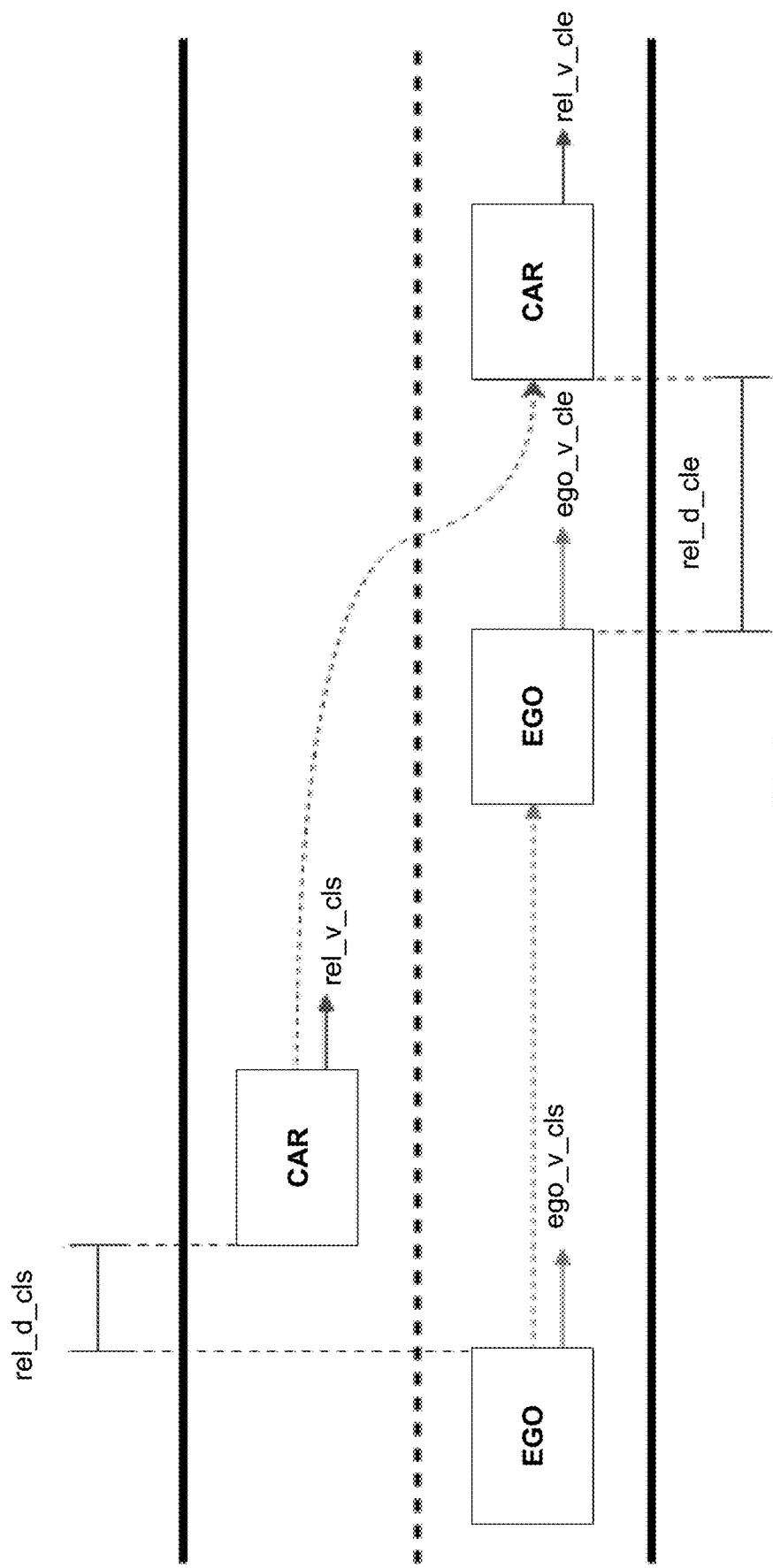
FIG. 5 is a schematic description of coverage metrics of the cut-in and slow scenario, according to an embodiment.

FIG. 5 is a schematic description of coverage metrics of the cut-in and slow scenario, according to an embodiment. The notations described in FIG. 5 are as follows: rel_d_cls describes the relative distance at change lane start point (intervals of 50 cm in [0 . . . 1500] cm); ego_v_cls describes the absolute speed at change lane start point of AV 410 (intervals of 10 km/h in [10 . . . 130] km/h); rel_v_cls describes the relative speed of vehicle 420 to AV 410 at change lane start point (intervals of 1 m/s in [−33 . . . 33] m/s); rel_d_cle describes the relative distance between AV 410 and vehicle 420 at change lane end point (intervals of 50 cm in [0 . . . 3000] cm); ego_v_cle describes the absolute speed of AV 410 at change lane end point (intervals of 10 km/h in [10 . . . 130] km/h); and rel_v_cle describes the relative speed of vehicle 420 to AV 410 at change lane end point (intervals of 1 m/s in [−33 . . . 33] m/s).

Coverage metrics, such as those described above, and the like, as well as any combination thereof, may be used to implement a scenario, either manually or automatically, according to the disclosed embodiments.

An example for a cut-in and slow scenario may be defined using MSDL as follows:

```
scenario ego::cut_in_and_slow {
    car1 : car;
    side : av_left_right;
    path : full path; //
    +path_length(path,100*meter, 250* meter);
     +path_min_driving_lanes(path, default 2);
```

In the above example, a field car1 of type car agent, the initial side on which the car starts, relative to ego, and a stretch of road are defined. Then, constrains the path to be in [100 . . . 250] meters long and the path to have at least 2 lanes is required.

In MSDL, all fields are randomizable by default, unless specified otherwise. This means that fields are given random values at runtime within their legal value space. Every field has a physical value space defined by its type's range of values, and a legal value space which is the intersection between physical value space and any constraints applied to it. For example, the side field has the physical value space of [left, right] and an identical legal value space, given there are no constraints applied to it. On the other hand, the path field has the physical value space that is the set of all road stretches that a map can provide, while the legal value space is reduced to only those road stretches that have a length inside [100 . . . 250] meters and at least two lanes. The '+path_*' are constraints applied to the characteristics of the road stretch to be selected. In an embodiment, the MSDL may provide a number of agents that help define scenarios or agents. Agents and scenarios can be defined automatically or manually, as described herein, as may be needed. Any scenario must be defined and executed in the context of an agent.

A scenario behavior may therefore be defined as follows:

```
scenario ego::cut_in_and_slow {
    do serial {
        get_ahead_of_ego: phase(duration: default in [1..5]*second) {
            get_ahead_of_ego_ego: ego_car.drive(path) {
                +set_speed(default [30..70]*kph)
            };
            get_ahead_of_ego_car1: car1.drive(path, adjust:
            TRUE) {
                +behind(ego_car, at: start);
            };
        }; // end of get_ahead_of_ego
        cut_in: phase(duration: default in [1..5]*second) {
            cut_in_ego: ego_car.drive(path);
            cut_in_car1: car1.drive(path) {
                +on_side_of(ego_car, side, at: start);
                +ahead_of_time(ego_car, default [1500..2000], at:
                start);
                +set_speed([30..100] * kph);
                +change_to_lane_of(ego_car);
            };
        }; // end of cut_in
        slow_down: phase(duration: default in [1..5]*second) {
            slow_ego: ego_car.drive(path);
            slow_car1: car1.drive(path) {
                +keep_lane( );
                +slow_down(default [10..15]*kph)};
        }; //end of slow_down
    };
};
```

In the above example, the 'do serial' is a built-in operator that describes sequential activities which are chained in the order of their definition. In the example embodiment, the 'get_ahead_of_ego' is executed first, followed by 'cut_in,' which is followed by 'slow_down.' The 'phase' is another built-in operator that describes parallel activities. For example 'ego_car.drive( )' and 'car1.drive( )' are executed in parallel. Each phase has a start and an end point in time. Similarly, the 'do serial' starts at the beginning of the first phase and finishes at the end of the last phase.

The complete list of phase end conditions may be found in the SDL Language Manual. According to an embodiment, the MSDL monitoring system 100 plans the trajectory of car1 such that car1 is onside of ego at the start of cut_in phase. In other words, the MSDL-based monitoring system 100 is adapted to infer all necessary movements in order to get to the desired position at the start of cut_in, which, in turn, eases test engineers' jobs and creates more diverse, concrete scenarios, thereby providing significant technical improvements over the prior art solutions.

It may be understood that the description provided describes a situation where the system actively controls car1 to cause a scenario to happen. In one embodiment, car1 is selected from the data stream (e.g., a video clip), and monitored to see if the interaction described in the 'cut-in-and-slow' scenario takes place. In the example embodiment, the system 100 (FIG. 1) is passive with respect of controlling car1.

In an embodiment, it is possible to further define the coverage within scenarios, either in the scenario definition or in an extension (also referred to as an 'aspect') of the scenario. The following is a non-limiting example of a cut in cover scenario extension:

```
<'
extend ego::cut_in {
    // sample parameters at the end of change_lane phase
    !rel_d_cls:= map.distance_between_locations(ego_car.location,
car1.location)
        @change_lane.start {
            cover it using
                text = "How long ahead is car1 relative to ego at
change_lane start (in centimeters)",
                unit=centimeter,
                range=[0..1500],
                every=50;
        };
        !ego_v_cls:= ego_car.speed @change_lane.start {
            cover it using
                text = "Absolute speed of ego at change_lane start
                (in km/h)",
                unit=kph,
                range=[10..130],
                every=10;
        };
        !rel_v_cls := (car1.speed – ego_car.speed) @change_lane.start {
            cover it using
                text = "Relative speed of car1 to ego speed at
change_lane start (in meter/second)",
                unit=(meter/second),
                range=[−33..33],
                every=1;
        };
        // sample the same parameters at the end of change_lane phase
        !rel_d_cle:= map.distance_between_locations(ego_car.location,
car1.location)
        @change_lane.end {
            cover it using
                text = "How ahead is car1 relative to ego at change_lane
end (in centimeter)",
                unit=centimeter,
                range=[0..3000],
                every=50;
        };
        !ego_v_cle:= ego_car.speed @change_lane.end {
            cover it using
                text = "Speed of ego at change_lane end (in kph)",
```

```
        unit=kph,
        range=[10..130], // TODO: down to 0?
        every=10;
    };
    !rel_v_cle := (car1.speed - ego_car.speed) @change_lane.end {
        cover it using
            text = "How faster is car1 relative to ego at change_lane
end (in meter/second)",
            unit=(meter/second),
            range=[-33..33],
            every=1;
    };
};
'>
```

According to an embodiment, a test engineer defining coverage takes into consideration two dimensions: what parameter values to sample, and when to sample them. Using the MSDL monitoring system 100, the test engineer is provided with constructs to specify which parameters to sample and to refine value sets that must be sampled (e.g. units, value ranges). Coverage definitions use events that specify the moment in time when a parameter should be sampled. In the above example, 'change_lane.start' and 'change_lane.end' are sampling events that activate the parameter sampling. Test engineers can use predefined events, or define and trigger custom events that reuse such predefined events.

The first stage of the test flow, according to an embodiment, is to load the MSDL sources to the monitoring system 100. The next step is to load and interpret the map that the scenario will use. At this point, the MSDL monitoring system 100 is ready to plan the list of actions. This phase expands the behavior described in the scenario into higher-granularity movement scenarios. It also chains various phases in the scenario.

If the planning phase succeeds, the test moves to simulation. In this phase the MSDL monitoring system 100 starts interacting with the simulator it advances the simulation, it retrieves agents' dynamic information (position, speed, acceleration), and it adjusts the plan, if necessary, in order to achieve the plan's goals. Notably, in any AV simulation there is a grain of unpredictability: the AV, which can take unpredictable decisions to handle situations, is forced by the traffic context. This means that the plan does not always match the reality, and the MSDL monitoring system 100 alleviates the side effects of the AV behavior by adjusting the plan at the end of each simulation step.

In another embodiment, MSDL source files may be loaded to the system (e.g., monitoring system 100). A data stream is thereafter provided. Agents are generated according to the disclosed embodiments described herein based on the selection of physical objects. The activity of the generated agents is then monitored in relation to, for example, the 'cut-in-and-slow' scenario. The monitor system generates events as it detects the occurrence of steps in the scenario. Coverage information is saved by the system and respective messages are issued accordingly.

Following is a description of the MSDL utilized according to various embodiments to define agents and scenarios. To verify the safety of an autonomous vehicle (AV) or an advanced driver assistance system (ADAS), behavior of a vehicle or system should be observed in various situations, or scenarios. Using Measurable Scenario Description Language (MSDL), scenarios that describe the behavior of the AV as well as other actors in the environment can be defined and created. Actors include vehicles, pedestrians, weather, road conditions and so on.

Because MSDL scenarios are high-level descriptions, many concrete variants of a scenario can be created by varying the scenario parameters, such as speed, vehicle type, weather conditions, and so on. In an embodiment, a MSDL tool may generate these variants automatically, within a set of specified constraints. Such constraints may be provided by a user. In an embodiment, the MSDL tool collect and aggregate parameter data from successful tests, thereby enabling to measure the safety of your AV.

The MSDL is a mostly-declarative programming language. The only scenario that executes automatically is the top-level scenario. The execution flow of the program can be controlled by adding scenarios to the top-level scenario. MSDL is an aspect-oriented programming language where modification to the behavior or aspects of some or all instances of an object can be made to suit the purposes of a particular verification test, without disturbing the original description of the object.

MSDL is a small, domain-specific language designed for describing scenarios where actors (sometimes called agents), such as cars and pedestrians, move through an environment. These scenarios have parameters that allows to control and constrain the actors, the movements, and the environment. MSDL is designed to facilitate the composition of scenarios and tests, making it possible to define complex behaviors using your own methodology. A minimal, extensible set of actors and scenarios comprise the fundamental building blocks. Some built-in scenarios perform tasks common to all scenarios, such as implementing parallel execution. Others describe relatively complex behavior, such as the 'car.drive' scenario.

By calling these scenarios, even more complex behavior, such as a vehicle approaching a yield sign can be described. For further complexity, multiple scenarios can be mixed. For example, a weather scenario can be mixed with a car scenario. It is easy to create new actors and new scenarios as the need arises, either from scratch, or using already defined scenarios. For example, the scenario 'cut_in', presented below, is defined using the scenario 'car.drive'. In an embodiment, a standard scenario library is provided to maintain all scenarios. New or customize scenarios are added to the library as needed.

MSDL Building Block

The building blocks of MSDL are data structures, including at least the followings:

Simple structs—a basic entity containing attributes, constraints and so on.

Actors—like structs, but also have associated scenarios.

Scenarios—describe the behavior of actors.

These data structures have attributes that hold scalar values, lists, and other structures. Attribute values can be described as expressions or calculated by external method definitions. The attribute values are controllable with keep( ) constraints, for example: keep(speed <50 kph).

Attribute values in scenarios are controllable either with keep( ) constraints or with scenario modifiers such as speedo. For example, speed(20 kph, faster_than: car1).

Data structures also define events, for example, event too_close is (distance_between(car1, car2)<10 m).

Scenario behavior can be described by calling the built-in scenarios. The operator scenarios serial, parallel, or mix can be activated or call, to implement a scenario in a serial or parallel execution mode or to mix it with another scenario.

Other built-in scenarios implement time-related actions, such as emit, wait, or error reporting.

Example Scenarios

Example 1 shows how to define and extend an actor using MSDL. The actor car_group is initially defined with two attributes. Then it is extended in a different file to add another attribute.

```
# Define an actor
actor car_group:
    average_distance: distance
    number_of_cars: uint
# Extend an actor in a separate file
import car_group.sdl
extend car_group:
    average_speed: speed
```

Example 2 shows how to define anew scenario named two_phases using MSDL. The scenario defines a single attribute, car1, which is a green truck, and uses the serial and parallel operators to activate the car1.drive scenario, then it applies the speed( ) modifier. Two_phases scenario operates as follows:

- During the first phase, car1 accelerates from 0 kph to 10 kph.
- During the second phase, car1 keeps a speed of 10 to 15 kph.

```
# A two-phase scenario
scenario traffic.two_phases: # Scenario name
    # Define the cars with specific attributes
    car1: car with:
        keep (it.color == green)
        keep (it.category == truck)
    path: path # a route from the map; specify map in the test
    # Define the behavior
    do serial:
        phase1: car1.drive(path) with:
            spd1: speed(0kph, at: start)
            spd2: speed(10kph, at: end)
        phase2: car1.drive(path) with:
            speed([10..15]kph)
```

Example 3 shows how to define the test to be run:
1. Import the proper configuration, to run a test using a simulator, e.g., SUMO simulator.
2. Import the defined two_phases scenario.
3. Extend the predefined, initially empty top.main scenario to invoke the imported two_phases scenario.

```
import sumo_config.sdl
import two_phases.sdl
extend top.main:
    set_map("/maps/hooder.xodr") # specify map to use in this test
    do two_phases( )
```

Example 4 shows how to define the cut in scenario. In it, car1 cuts in front of the dut.car, either from the left or from the right. Dut.car, also called the ego car, is predefined. It should be noted that this scenario is more abstract than two_phases.

The 'cut in' scenario includes three parameters:
The car doing the cut_in (car1).
The side of the cut_in (left or right).
The path (road) used by the two cars, constrained to have at least two lanes.
Then we define the behavior
In the first phase, car1 gets ahead of the ego.
In the second phase, car1 cuts in front of the ego.
The scenario modifiers speed( ), position( ) and lane( ) are used here. Each can be specified either in absolute terms or in relationship to another car in the same phase. Each can be specified for the whole phase, or just for the start or end points of the phase.

```
# The cut-in scenario
scenario dut.cut_in( ):
    car1: car # The other car
    side: av_side # A side: left or right
    path: path
    path_min_driving_lanes(path, 2) # Needs at least two lanes
    do serial( ):
        get_ahead: parallel(duration: [1..5]s): # get_ahead is a label
            dut.car.drive(path) with:
                speed([30..70]kph)
            car1.drive(path, adjust: true) with:
                position(distance: [5..100]m,
                    behind: dut.car, at: start)
                position(distance: [5..15]m,
                    ahead_of: dut.car, at: end)
        change_lane: parallel(duration: [2..5]s): # change_lane is a label
            dut.car.drive(path)
            car1.drive(path) with:
                lane(side_of: dut.car, side: side, at: start)
                lane(same_as: dut.car, at: end)
```

Example 5 shows how to define the two_cut_in scenario using the cut_in scenario. The two_cut_in scenario executes a cut_in scenario from the left followed by a cut_in from the right. Furthermore, the colors of the two cars involved are constrained to be different.

```
# Do two cut-ins serially
import cut_in.sdl
scenario dut.two_cut_ins( ):
    do serial( ):
        c1: cut_in( ) with: # c1 is a label
            keep(it.side == left)
        c2: cut_n( ) with: # c2 is a label
            keep(it.side == right)
            keep(c1.car1.color != c2.car1.color)
```

Example 6 shows how to run cut_in with concrete values. The original cut_in specified ranges, so by default, each run would choose a random value within that range. Tests can be defined as concrete using constraints.

```
Run cut_in with concrete values
import cut_in.sdl
extend top.main:
    do dut.cut_in( ) with:
        keep(it.get_ahead.duration == 3s)
        keep(it.change_lane.duration == 4s)
```

Example 7 shows how to mix multiple scenarios: the cut_in scenario, another scenario called interceptor_at_yield, and a set_weather scenario. The mix_dangers scenario has a single attribute of type weather_kind, which is constrained to be not nice (i.e., !nice), because we want a dangerous situation. This attribute is passed to set_weather.

```
# Mixing multipie scenarios
import my_weather.sdl
import interceptor.sdl
import interceptor_at_yieid.sdl
import cut_in.sdl
```

-continued

```
scenario dut.mix_dangers:
    weather: weather_kind
    keep(weather != nice)
    do mix( ):
        cut_in( )
        interceptor_at_yield( )
        set_weather(weather)
```

Example 8 runs mix_dangers. In this case, a concrete weather (rain) is specified rather than a non-specific term (e.g. non-nice weather).

```
# Activating mix_dangers
import mix_dangers_top.sdl
extend top.main:
    do mix_dangers( ) with:
        keep(it.weather == rain)
```

Summary of Lexical Conventions:

MSDL is similar to Python scripting language. An MSDL program is composed of statements that declare or extend types, such as structs, actors, scenarios, or import other files composed of statements. Each statement includes an optional list of members indented one unit (a consistent number of spaces) from the statement itself. Each member in the block, depending on its type, may have its own member block, indented one unit from the member itself. Thus, the hierarchy of an MSDL program and the place of each member in that hierarchy is indicated strictly by indentation.

Common indentation indicates members at the same level of hierarchy. It is recommended to use multiples of four spaces (blanks) to indicate successive hierarchical levels, but multiples of other units (two, three, and so forth) are allowed, as long as usage is consistent. Inconsistent indentation within a block is an error. Tabs in the code are translated into spaces. Members (other than strings) that are too long to fit in a single physical line can be continued to the next line after placing a backslash character (\) before the newline character. However, a line with an open parenthesis (or open square bracket [ flows across newlines with no need for a backslash character. Inline comments are preceded by a hashtag character (#) and end at the end of the line. Block comments are allowed. Each line in the block must begin with the /* characters and end with */. Nested block comments are allowed. Newlines within comments and indentation of comments does not affect code nesting.

MSDL Constructs

Statements are top-level constructs that are outside of any other construct in the program. Statements include:
  Enumerated type declarations
  Struct declarations
  Actor declarations
  Scenario declarations
  Scenario modifier declarations
  Extensions to those declarations
  Import statements Statements are top-level constructs that define or extend a type or import a file composed of statements. Enumerated type declarations define a set of explicitly named values. For example, an enumerated type driving_style may define a set of two values: normal and aggressive. Struct declarations define compound data structures that store various types of related data. For example, a struct called car_collision may store data about the vehicles involved in a collision. Actor declarations model entities like cars, pedestrians, environment objects like traffic lights, etc. The statements are compound data structures that store information about these entities. In contrast to structs, they are also associated with scenario declarations or extensions. Thus, an actor is a collection of both related data and declared activity.

Scenario declarations define compound data structures that describe the behavior or activity of one or more actors. The behavior of scenarios can be controlled, and data about their execution can be collected by declaring data fields and other members in the scenario itself or in its related actor or structs. Example scenarios are car.drive, dut.cut_in, dut.cut_in_with_person_running, and so on. Scenario modifier declarations modify, but do not define, scenario behavior, by constraining attributes such as speed, location and so on. Scenario modifier declarations can include previously defined modifiers. Extensions to an existing type or subtype of an enumerated type, a struct, an actor or a scenario add to the original declaration without modifying it. This capability allows to extend a type for the purposes of a particular test or set of tests.

Struct, actor or scenario members. The following constructs can appear only inside a struct, actor, or scenario declaration or extension. These constructs include:
  Coverage definitions
  Events
  Field declarations
  Field constraints (keep( ))
  External method declarations
  when subtypes
  Note scenarios are associated with specific actors but are declared as top-level statements.

The constructs described in this section can appear only within a struct, actor or scenario declaration or extension. Cover definitions allows to sample key parameters related to scenario execution. Collecting this data over multiple executions of a scenario allow to evaluate the safety of the AV. For example, if a car actor has a field speed, the value of this field at key points during a scenario may be collected.

Cover definitions appear in scenarios to have access to the scenario's parameters and to vary coverage definitions according to the scenario. Field declarations define a named data field of any scalar, struct or actor type or a list of any of these types. The data type of the field must be specified. For example, this field declaration defines a field named legal_speed of type speed. Field constraints defined with keep( ) restrict the values that can be assigned to or generated for data fields. For example, because of the following keep( ) constraint, randomized values for legal_speed are held below 120 kph:
  keep(legal_speed<120 kph)
  This constraint can also be written as follows, with the implicit variable it referring to the legal_speed field:
  legal_speed: speed with:
    keep(it<120 kph)

Events define a particular point in time. An event is raised by an explicit emit action in a scenario or by the occurrence of another event to which it is bound. Scenarios and scenario phases have three predefined events: start end and fail. when subtypes extend an object when a specified condition is true. For example, if an actor my_car has a field of type driving_style, the actor's attributes or behaviors can be different when the value of driving style is aggressive from when it is normal. External method declarations identify imperative code written in other programming languages, such as C++, Python, and the e verification language, can be call from an MSDL program. For example, an external method to calculate and return a value based on a scenario's parameters may be called.

Scenario members. Scenario members appear within a scenario declaration or extension. Scenario members include:

Members allowed in structs or actors
Scenario modifier invocations
do (behavior definition)

Scenarios have two members that are not allowed in structs or actors. Scenario modifiers are scenarios that constrain various attributes of a scenario's behavior. They do not define a scenario's primary behavior. There are both relative and absolute modifiers. In the example below, the speed( ) modifier sets the speed of the affected car to be 1 to 5 kph faster relative to car1:

speed([1 . . . 5] kph, faster_than: car1)

The 'do' scenario member defines the behavior of the scenario when it is invoked.

Scenario Invocations.

The following types of scenarios can be invoked:
Operator scenarios
Event-related scenarios
Zero-time scenarios
User-defined scenarios Scenario invocations extend the execution of an MSDL program. A built-in top.main scenario is automatically invoked. Top.main needs to be extended to invoke other scenarios, defining the behavior of the whole SDL program.

Expressions.

Expressions can be used within statements or members and evaluate to values of the specified type. Expressions are allowed in constructs as specified. The expression must evaluate to the specified type. Expressions can include calls to external value-returning methods.

Data Types

MSDL defines the following data types:
Scalar types hold one value at a time: numeric, Boolean and enumerated.
List types hold multiple values of one type.
String types hold a sequence of ASCII characters enclosed in double quotes.
Resource types hold a list of map junctions and segments.
Real types hold floating-point values.
Compound types hold multiple values of multiple types.

Physical Types

Physical types are used to characterize physical movement in space, including speed, distance, angle and so on. When specifying a value for one of these types in an expression or defining coverage for it, a respective unit has to be defined and used. As shown in the table below, a choice of units for the mostly commonly used types can be selected. Physical constants have implied types. For example, 12.5 km has an implied type of distance. Examples: 2 meters, 1.5 s, [30 . . . 50] kph.

Following are standard physical units used: acceleration. kphps (=kph per second), mpsps (=meters per second per second) angle. deg, degree, rad, radian angular_speed. degee_per_second, radan_per_second distance. mm, millimeter, cm, centimeter, in, inch, feet, m, meter, km, kilometer, mile speed. kph, kilometer_per_hour, mph, mile_per_hour temperature. c, celsius, f, Fahrenheit time. ms, millisecond, s, sec, second, min, minute, hr, hour weight kg, kilogram, ton.

Enumerated Types

Enumerated types represent a set of explicitly named values. In the following example, the enumerated type driving_style has two values, aggressive and normal.

type driving_style: [aggressive, normal]

List Types

A list is a way to describe a container of similar values in MSDL. A list can contain any number of elements from a data type. For example, a convoy can be declared to contain a list of car actors, or a shape as a list of points. List literals are defined as a comma-separated list of items, for example:

[point1, point2]

The [n . . . n] notation is not allowed for lists; it is reserved for ranges. Examples of lists are:

convoy: list of car
shape: list of point

Example of list assignments is:
shape: list of point with:
  keep(it==[map.explicit_point("−15",0.20 m,1),
    map.explicit_point("−15",0,130 m,1)]

Example of list constraint is:
distances: list of distance with:
  keep(it==[12 km, 13.5 km, 70 km])

Resource Types

Resource types include junction and segment, utilized to hold a global list of locations on the current map.

Compound Types

MSDL defines three built-in compound types: Scenarios define behavior, such as a car approaching a yield sign, a pedestrian crossing the street, and so on. Scenarios define behavior by activating other scenarios. MSDL provides a library of built-in scenarios describing basic behavior, such as moving, accelerating, turning and so on. Actors typically represent physical entities in the environment and allow scenarios to define their behavior. MSDL provides a set of built-in actors, including car, traffic, env, and so on. If an instance of the actor car in a program with the name my_car is created, its built-in scenario drive can be invoked as my_car.drive. Structs define sets of related data fields and store the values assigned or generated by the program for those fields. For example, a struct might store a car's location, speed, and distance from other cars at a particular time.

Compound types can be extended to include new data or behavior, and their definitions can be passed to new compound types by like inheritance. For example, the predefined actor car can be extended to include new scenarios, or can create a new actor my_car that inherits the scenarios of car and then add new scenarios. Compound types can also be extended conditionally using when inheritance. With this feature, a type is extended only when a specified condition is true. For example, if an actor my_car has a field of type driving_style, the actor's attributes or behaviors can be different when the value of driving style is aggressive from when it is normal.

Predefined AV Types

An MSDL environment contains several predefined actors. The actor top contains instances of the following actors: builtin represents MSDL's built-in scenarios; av_sim_adapter represents MSDL's simulator interface; map represents the sets of paths traveled by actors; traffic represents cars, pedestrians and so on; env represents environmental systems and has scenarios such as weather and time of day; and, dut represents the AV system or device under test. Under traffic, there is a list called cars of car actors. Under dut there are: a dut.car of type car represents the actual dut car (also called the ego); and, possibly, other actors, corresponding to various supervisory functions and so on.

It should be noted that because map, env, traffic and dut are instantiated as fields in top, these fields can be accessed directly as global actors, without reference to their place in the hierarchy, for example:

keep(x==env.time_of_day)

keep(car_in_posiion==map.reach(car1, point1))

Any actor can be extended in this hierarchy to add actors. MSDL can create actors before or during a run. Upon creation, an actor's fields are randomized according to the constraints that have been specified, and its built-in start scenario starts running in active mode. A start scenario can execute other scenarios, and these also run in active mode. The scenario top.main( ) is called indirectly from top.start( ). This scenario is initially empty and defines what the test does. Thus, to make your test run the cut_in_and_slow scenario, can extend top.main can be extended:

extend top.main:
    do c: cut_in_and_slow( )

Predefined env Actor

The env actor is a global actor, and contains all environment-related activity. It has scenarios which change the environment like weather and time_of_day, for example:

weather(kind: rain, temperature: 12.5c, duration: 3 min)

time_of_day(part: evening, start_time: 18 hr)

The type part is morning, noon, evening, or night and kind is rain, snow, sunshine. For example:

```
scenario dut.cut_in_and_rain:
    do mix( ):
        cut_in( )
        weather(rain)
        time_of_day(afternoon)
```

Predefined Car Actor Fields

The following fields of the car actor can be extended or constrained to match the allowed types of your simulator. These fields can be sampled and use them in coverage definitions.

| | |
|---|---|
| avoid_collisions: bool | The default is false. When constrained to true, a car actor instance tries to avoid collisions. |
| category: car_category | The car_category type is defined as sedan, truck, bus, van, semi_trailer, trailer, four_wheel_drive. |
| color: car_color | The car_color type is defined as white, black, red, green, blue, yellow, brown, pink, grey. |
| driving_style | Relevant only for non DUT cars, the style type is defined as aggressive, normal. |
| length: distance | Car length. |
| max_speed: speed | Maximum speed. The default is 120 kph. |
| model: string | Initially an empty string. |
| speed, acceleration and road_position | These fields hold the current, speed, acceleration and road position of a car actor instance. Note: These fields must be assigned values during the run. |
| width: distance | Car width. |

The car actor also has a scenario called drive, drive is a movement scenario, and it has a path parameter that represents the path to drive on. A scenario modifier can be specified inside a car's drive scenario.

PREDEFINED ENUMERATED TYPES. The various enumerated types are listed in the below table:

| Type Name | Values |
|---|---|
| av_car_side | front, front_left, left, back_left, back, back_right, right, front_right, other |
| av_side | right, left |
| car_category | sedan, truck, bus, van, semi_trailer, trailer, four_wheel_drive |
| car_color | white, black, red, green, blue, yellow, brown, pink, grey |
| curvature | other, straightish, # [−1e−6 . . . 1e−6], soft_left, # (1e−6 . . . 1e−12], hard_left, # (1e−12 . . . 1e−18], soft_right, # [−1e−12 . . . −1e−6), hard_right] # [−1e−18 . . . −1e−12) |
| direction | other, straight, # (−20 . . . 20] degrees, rightish, # (20 . . . 70] degrees, right, # (70 . . . 110] degrees, back_right, # (110 . . . 160] degrees, backwards, # (160 . . . 200] degrees, back_left, # (200 . . . 250] degrees, left, # (250 . . . 290] degrees, leftish] # (290 . . . 340] degrees |
| lane_use | none, car, pedestrian, cyclist |
| lane_type | none, driving, stop, shoulder, biking, sidewalk, border, restricted, parking, median, road_works, tram, entry, exit, offRamp, onRamp, rail, bidirectional |
| road_condition | paved, gravel, dirt |
| sign_type | speed_limit, stop_sign, yield, roundabout |
| time_of_day | midnight, sunrise, morning, noon, afternoon, sunset, evening |
| weather_kind | clear, cloudy, wet, wet_cloudy, soft_rain, mid_rain, hard_rain |

User Task Flow

The verification task flow that MSDL supports is as follows:

1. Plan the verification project.

Identify the top-level scenario categories that represent risk dimensions such as urban driving, highway driving, weather, sensor malfunction and so on.

Identify the scenario subcategories. For example, lane-changes may be a subcategory of highway driving.

Identify the behaviors in each scenario subcategory. For example, cutting-in-and-slowing-down would be a behavior in the lane changes subcategory.

Identify the coverage collection points to determine how thoroughly each scenario has been covered (exercised successfully). For example, the cutting-in-and slowing-down behavior might have coverage paints including road conditions, distance, and speed.

Identify the checking criteria (grading) used to judge how well the DUT performed in various scenarios.

Identify coverage goals for those behaviors and scenarios.

2. Create the verification environment.

Describe the scenarios, behaviors and coverage points in MSDL, basing them on lower-level built-in scenarios or available in a library.

Identify the DUT and the execution platform.

Identify any other additional tools that can be used.

3. Automate test runs.

Write tests, possibly mixing scenarios from different subcategories, such as cutting-in and slowing-down with conflicting-lane-changes.

Launch multiple runs with different values for the scenario's variables, such as road conditions, speed and visibility.

4. Analyze failures.
   Identify the cause of any checking error, such as collision or near collision.
   Fix the DUT or apply a temporary patch so that tests can continue.
   Rerun all failed runs automatically.
5. Track progress.
   Analyze the coverage data correlated with each goal specified in the verification plan to determine which scenarios have not been adequately tested.
   Write new tests to reach those corner cases.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

What is claimed is:

1. A method performed by a computer-implemented monitoring system for monitoring behavior of a simulated device under test (DUT), comprising:
   receiving a data stream of an at least one physical object;
   generating a plurality of agents, wherein each of the plurality of agents describes a physical object, wherein at least one of the plurality of agents is an agent for the DUT and wherein an agent for the at least one physical object is one of the plurality of agents, and wherein generating the agent for the at least one physical object is based on the received data stream;
   generating a plurality of scenarios, wherein each scenario models a behavior of at least one of the plurality of agents;
   monitoring an interaction between the plurality of agents other than the DUT agent and the DUT agent for a scenario modeling the agents;
   generating an error indication based on the monitoring when there is a failure of the DUT agent to respond in a manner priorly defined as acceptable during at least one of the plurality of scenarios;
   generating an alert corresponding to the error indication when the error indication is generated; and
   supplying information to enable recreation of a sequence that led to the error indication when an error indication is generated.

2. The method of claim 1, wherein the at least one physical object includes more than one physical object.

3. The method of claim 2, further comprising:
   generating at least a scenario for at least one object of the more than one physical objects.

4. The method of claim 1, wherein the at least one physical object describes at least one of: a vehicle, a road, a sidewalk, a person, an animal, a traffic light, a traffic cone, a barrier, a bicycle, a train, and a weather element.

5. The method of claim 1, wherein the DUT agent is an autonomous vehicle (AV).

6. The method of claim 1, wherein a first scenario of the plurality of scenarios includes at least a second scenario of the plurality of scenarios.

7. The method of claim 5, wherein a scenario of the plurality of scenarios describes at least one of: a cut-in in front of another vehicle, a cut from a left lane of another vehicle, a cut from a right lane of another vehicle, cuts from two lanes simultaneously, slowing in front of the autonomous vehicle, cutting and slowing in front of the DUT, and traffic light changes.

8. The method of claim 1, further comprising:
   generating, based on the monitoring, at least one of: a notification upon detection of a monitored event, a key performance indicator (KPI), and a coverage information.

9. The method of claim 1, wherein the data stream comprises one or more video segments.

10. The method of claim 1, further comprising:
    executing by the computer-implemented monitoring system at least two of the plurality of agents in parallel.

11. The method of claim 1, further comprising:
    executing by the computer-implemented monitoring system at least two of the plurality of scenarios in parallel.

12. The method of claim 1, wherein each scenario of the plurality of scenarios and each agent of the plurality of agents are described in a measurable scenario descriptive language (MSDL).

13. The method of claim 12, wherein the MSDL is a declarative programming language for describing the behavior of the DUT and physical objects.

14. A non-transitory computer readable medium having stored thereon instructions for causing a processing circuitry to execute the method of claim 1.

15. A system for monitoring behavior of a simulated device under test (DUT), comprising:
    a network interface;
    an input/output (I/O) interface;
    a database;
    a processing unit communicatively connected to the network interface, the I/O interface and the database, the processing unit being adapted to execute a plurality of instructions provided thereto;

a memory, a portion of which contains instructions for execution, wherein upon execution of the instructions by the processing unit, the monitoring system is adapted to:

receive a data stream of an at least one physical object;

generate a plurality of agents, wherein each of the plurality of agents describes a physical object, wherein at least one of the plurality of agents is an agent for the DUT and wherein an agent for the at least one physical object is one of the plurality of agents, and wherein generating the agent for the at least one physical object is based on the received data stream;

generate a plurality of scenarios, wherein each scenario models a behavior of at least one of the plurality of agents;

monitor an interaction between the plurality of agents other than the DUT agent and the DUT agent for a scenario modeling the agents;

generate an error indication based on the monitoring when there is a failure of the DUT agent to respond in a manner priorly defined as acceptable during at least one of the plurality of scenarios;

generate an alert corresponding to the error indication when the error indication is generate; and supply information to enable recreation of a sequence that led to the error indication when an error indication is generated.

16. The system of claim 15, wherein the at least one physical object includes more than one physical object.

17. The system of claim 16, wherein the system is further configured to:

generate at least a scenario for at least one object of the more than one physical objects.

18. The system of claim 15, wherein the at least one physical object describes at least one of: a vehicle, a road, a sidewalk, a person, an animal, a traffic light, a traffic cone, a barrier, a bicycle, a train and a weather element.

19. The system of claim 15, wherein the DUT agent is an autonomous vehicle (AV).

20. The system of claim 15, wherein a first scenario of the plurality of scenarios includes at least a second scenario of the plurality of scenarios.

21. The system of claim 19, wherein a scenario of the plurality of scenarios describes at least one of: a cut-in in front of another vehicle, a cut from a left lane of another vehicle, a cut from a right lane of another vehicle, cuts from two lanes simultaneously, slowing in front of the autonomous vehicle, cutting and slowing in front of the DUT, and traffic light changes.

22. The system of claim 15, wherein the system is further configured to:

generate, based on the monitoring, at least one of: a notification upon detection of a monitored event, a key performance indicator (KPI), and a coverage information.

23. The system of claim 15, wherein the data stream comprises one or more video segments.

24. The system of claim 15, wherein the system is further configured to:

execute by the system at least two of the plurality of agents in parallel.

25. The system of claim 15, wherein the system is further configured to:

execute by the system at least two of the plurality of scenarios in parallel.

26. The system of claim 15, wherein each scenario of the plurality of scenarios and each agent of the plurality of agents are described in a measurable scenario descriptive language (MSDL).

27. The system of claim 26, wherein the DUT agent is an autonomous vehicle (AV) and wherein the MSDL is a declarative programming language for describing the behavior of the autonomous vehicle and physical objects.

* * * * *